United States Patent [19]

Gardner et al.

[11] Patent Number: 5,316,981

[45] Date of Patent: May 31, 1994

[54] METHOD FOR ACHIEVING A HIGH QUALITY THIN OXIDE USING A SACRIFICIAL OXIDE ANNEAL

[75] Inventors: Mark I. Gardner, Red Rock; Henry J. Fulford, Jr., Austin, both of Tex.

[73] Assignee: Advanced Micro Devices, Inc., Sunnyvale, Calif.

[21] Appl. No.: 959,230

[22] Filed: Oct. 9, 1992

[51] Int. Cl.⁵ ............................................ H01L 21/02
[52] U.S. Cl. ................................... 437/235; 437/238; 437/239; 437/10; 437/52; 437/983
[58] Field of Search ................. 437/235, 238, 239, 10, 437/52, 983

[56] References Cited

U.S. PATENT DOCUMENTS

| | | | |
|---|---|---|---|
| 3,945,856 | 3/1976 | Koenig et al. | 437/931 |
| 4,329,773 | 5/1982 | Geipel, Jr. et al. | 437/238 |
| 4,517,732 | 5/1985 | Oshikawa | 437/43 |
| 4,567,645 | 2/1986 | Cavanagh et al. | 437/976 |
| 4,784,975 | 11/1988 | Hofmann et al. | 437/238 |
| 4,894,353 | 1/1990 | Ibok | 437/239 |
| 5,057,463 | 10/1991 | Bryant et al. | 437/238 |
| 5,077,230 | 12/1991 | Woo et al. | 437/69 |
| 5,208,173 | 5/1993 | Yamada et al. | 437/43 |
| 5,210,056 | 5/1993 | Pong et al. | 437/983 |
| 5,215,934 | 6/1993 | Tzeng | 437/983 |
| 5,219,774 | 6/1993 | Vasché | 437/238 |
| 5,225,355 | 7/1993 | Sugino et al. | 437/10 |
| 5,225,361 | 7/1993 | Kakiuchi et al. | 437/43 |

*Primary Examiner*—Brian E. Hearn
*Assistant Examiner*—Trung Dang
*Attorney, Agent, or Firm*—Skjerven, Morrill, MacPherson, Franklin & Friel

[57] ABSTRACT

The quality of both a gate oxide and a tunnel oxide in a P-well of a CMOS EEPROM process is improved by growing and subsequently annealing in-situ a gate oxide. A photoresist layer is then applied and defined to expose regions of the gate oxide which are then etched to expose the surface of the semiconductor, and after which the photoresist layer is removed. Subsequently, the remaining gate oxide is partially etched to reduce the thickness of the gate oxide and to remove any native oxide which may have formed over the exposed semiconductor surface. Finally, a tunnel oxide is grown upon the exposed semiconductor surface. The quality of this tunnel oxide is dramatically improved due to the in-situ anneal of the gate oxide, even though the gate oxide (in the region of the tunnel oxide) is totally removed before tunnel oxide growth. Furthermore, the re-oxidized gate oxide which was not entirely removed before tunnel oxide growth also exhibits higher breakdown voltages.

13 Claims, 9 Drawing Sheets

| STEP | GASSES | TEMP | TIME |
|---|---|---|---|
| I. Push/ Stabilize | Low $O_2$/Ar | Ramp to 800° C Final Temp | t=30 min. |
| II. Ramp to 900 | Low $O_2$/Ar | 900° C Final Temp | t=30 min. |
| III. Oxidation | $O_2$ | 900° C | t=32 min. 15 sec. |
| IV. HCL Getter | HCL/Ar | 900° C | t=9 min. |
| V. Oxidation | $O_2$ | 900° C | t=23 min. 45 sec. |
| VI. HCL Getter | HCL/Ar | 900° C | t=9 min. |
| VII. Oxidation | $O_2$ | 900° C | t=23 min. 45 sec. |
| VIII. Ar Anneal | Ar | 900° C | t=variable see table of Fig. 9 |
| IX. Ramp Down to 800° C | Ar | 800° C Final Temp | t=variable see table of Fig. 9 |

FIG. 8

| SPLIT | POST GROWTH IN-SITU ANNEAL | RAMP DOWN |
|---|---|---|
| 900-0 | T=900° C Anneal t=0 min. | baseline process time=30 min. |
| 900-30 | T=900° C Anneal t=30 min. | same as baseline ramp down (time=30 min.) |
| 950-0 | T=950° C Anneal t=0 min. | time=45 min. |
| 950-30 | T=950° C Anneal t=30 min. | time=45 min. |
| 1000-0 | T=1000° C Anneal t=0 min. | time=60 min. |
| 1000-30 | T=1000° C Anneal t=30 min. | time=60 min. |

FIG. 9

METHOD FOR ACHIEVING A HIGH QUALITY THIN OXIDE USING A SACRIFICIAL OXIDE ANNEAL

BACKGROUND OF THE INVENTION

1. Field of the Invention

This invention relates to the fabrication of semiconductor devices, and more specifically, to methods for achieving a high quality oxide on the surface of a semiconductor substrate.

2. Description of Related Art

The importance of high quality oxides in the fabrication of semiconductor devices cannot be overemphasized. Many broad categories of commercial devices, such as Electrically Erasable Programmable Read-Only Memories (EEPROMS), Dynamic Random Access Memories (DRAMs), and more recently, even high-speed basic logic functions, owe their commercialization to the reproducibility of high quality, very thin oxide layers.

Major improvements in gate oxide quality have been achieved by improved cleaning techniques, the addition of HCL/TCA to the gate oxidation process, and higher purity gasses and chemicals. RCA cleaning techniques are described in "Dependence of Thin Oxide Quality on Surface Micro-Roughness" by T. Ohmi, et. al., IEEE Transactions on Electron Devices, Vol. 39, Number 3, March 1992. Other techniques have incorporated different gas ($NH_3$, ONO, WET $O_2$) schemes in the gate oxidation cycle other than the conventional $O_2$ with HCL or TCA. Also considerable progress has been made with single wafer RTA gate processing, as is described in "Effect of Rapid Thermal Reoxidation on the Electrical Properties of Rapid Thermally Nitrided Thin-Gate Oxides", by A. Joshi, et. al., IEEE Transactions on Electron Devices, Vol. 39, Number 4, April 1992.

These techniques refer to "gate oxides" as in the gate of an MOS transistor, but are usually applicable to any thin (usually less than 300 Å) oxide. The "tunnel" oxide of an EEPROM process technology is a very thin gate oxide (usually less than 100 Å), with the somewhat unusual requirement that it be grown above a very heavily doped N+ layer. Oxides grown from heavily doped substrate surfaces are generally considered to be lower in quality than those grown from more lightly doped surfaces, as would be the case for most MOS transistor processes.

In some processes, the growth of a gate or tunnel oxide is preceeded by the growth and removal of one or more sacrificial oxide layers for purposes not directly related to thin oxide quality. Sacrificial oxides have been used for years in semiconductor processing for a variety of purposes. They can be useful in removing surface contaminants from a wafer, and thus many fabrication processes begin with the growth and immediate removal of an oxide layer. Etch stops can be fashioned effectively using oxides, as in the use of an oxide layer grown before the deposition of nitride in a LOCOS process. The oxide layer provides an etch stop for the removal of the nitride. Without the oxide layer between the nitride and the silicon substrate, the etchant used to remove the nitride would attack the silicon substrate as well.

In each such case the sacrificial oxide has a definite purpose not directly related to thin oxide quality, after which it is usually removed. The process sequences usually include no superfluous steps, as each unnecessary step increases the manufacturing time, increases the cost, and potentially lowers the yield of the resulting circuits. Despite the care taken in forming thin oxides, further quality improvement is desirable.

SUMMARY OF THE INVENTION

The present invention advantageously anneals a sacrificial oxide to improve the quality of subsequently grown oxides, including the tunnel oxides of EEPROM devices.

In one embodiment, a sacrificial oxide is grown and annealed, then removed from the surface by etching, followed by the growth of a final oxide. In an embodiment for an EEPROM process, a gate oxide is annealed before it is removed by etching, and subsequently followed by growing a tunnel oxide for the EEPROM cell.

BRIEF DESCRIPTION OF THE DRAWINGS

FIG. 8 is a table showing the gate oxidation cycle for the process of FIGS. 1-7.

FIG. 9 is a table showing the gate oxide anneal matrix used to study the effect of gate oxide anneal conditions on subsequently-grown tunnel oxide quality.

DETAILED DESCRIPTION OF THE PREFERRED EMBODIMENTS

We have found that annealing a sacrificial oxide, which is then removed, can greatly improve the integrity of a subsequently grown thin oxide. Annealing the sacrificial oxide improves the surface qualities of the substrate beneath the sacrificial oxide. Even though this annealed sacrificial oxide is then removed, the improved surface qualities of the substrate provide for a subsequently grown oxide of significantly higher quality. Furthermore, we have found that an initial gate oxide which is grown and subsequently annealed, then etched back and re-oxidized to a final gate oxide, exhibits a higher breakdown voltage than if processed without the anneal step.

FIGS. 1-7 are cross-sectional views illustrating a sequence of process steps for forming gate and tunnel oxides in a P-well active area of a CMOS EEPROM process. The gate oxide is used to fabricate N-channel MOS transistors, and the tunnel oxide is used to fabricate a structure useful to an EEPROM cell element.

Figure 1:
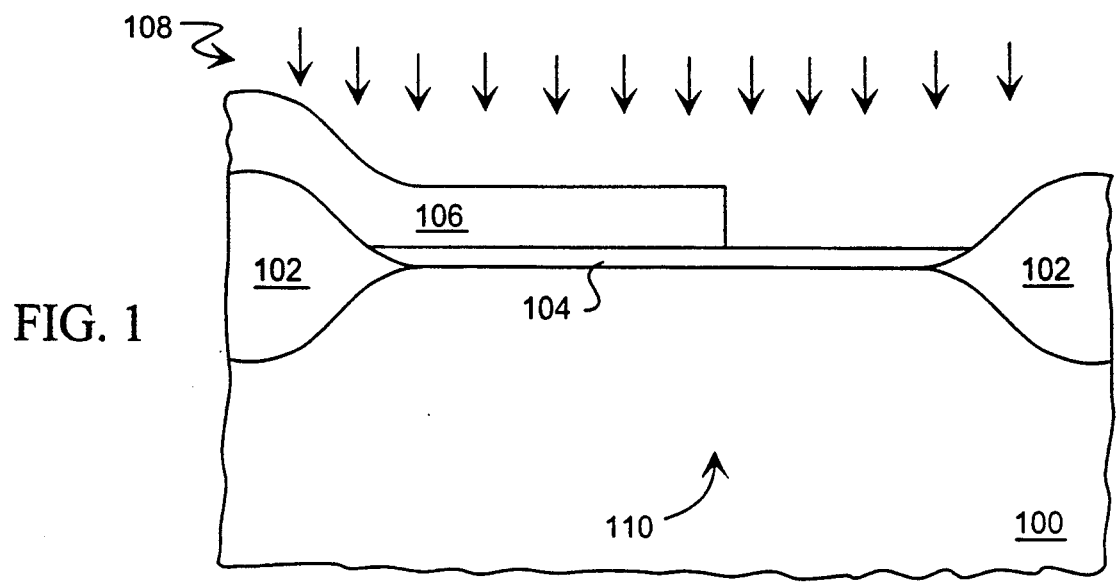
FIGS. 1-7 are cross-sectional views illustrating a sequence of process steps for forming gate and tunnel oxides in a P-well active area of a CMOS EEPROM process.
Figure 2:
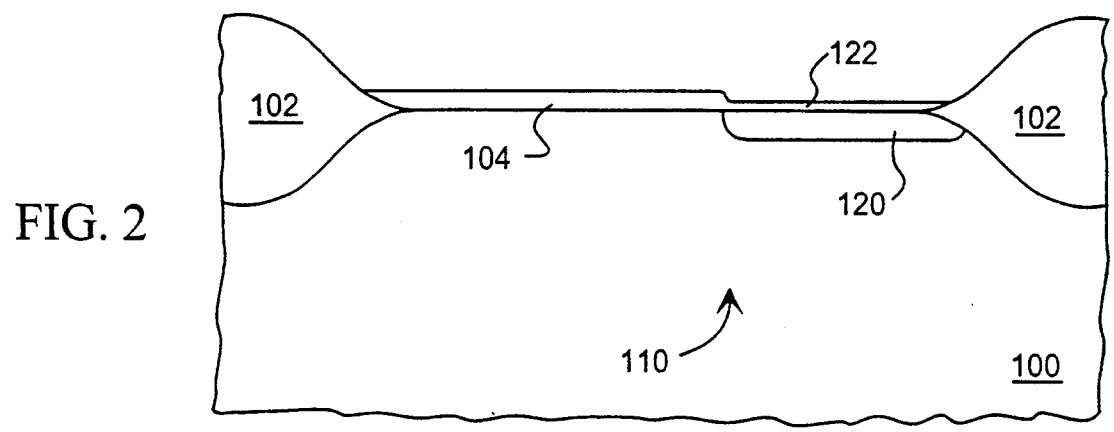

Referring to FIG. 1, P-well field oxides 102 are formed using a LOCOS process upon substrate 100. P-well field oxides 102 define a P-well active area 110 between the field oxides 102. KOOI oxide 104 then is grown in a steam oxidation environment to a thickness of approximately 300 Å. The growing and subsequent removing of KOOI oxide is a well known procedure for eliminating the remnant KOOI ribbon of nitride which forms around the active area at the LOCOS edge during the previous field oxidation. (Silicon nitride in a steam oxidation environment decomposes into ammonia and silicon dioxide. The ammonia diffuses down through the field oxide until reaching the silicon surface, where it reacts to form a silicon nitride, and leaving a ribbon of nitride at the silicon/silicon dioxide interface around the edge of the active area.) Photoresist then is applied and defined to form photoresist layer 106 which exposes a portion of the KOOI oxide 104 over the P-well active area 110.

Next, a phosphorus implant 108 is implanted through the exposed KOOI oxide and into the substrate 100 in the P-well active area 110 for the EEPROM process of this embodiment. Other regions of the substrate are masked by the photoresist layer 106. Photoresist layer 106 is then removed and the surface is prepared for annealing by an RCA clean operation, resulting in the structure shown in FIG. 2. Phosphorus implant layer 120 has been created by the heavy dose of the phosphorus implant 108. Due to the implant damage to the KOOI oxide which was exposed to the phosphorus implant 108, the RCA clean operation etches some of the implant-damaged KOOI oxide, resulting in etched KOOI oxide 122 approximately 100 Å thick in the region above phosphorus implant layer 120. KOOI oxide 104 which was formerly protected by photoresist layer 106 and consequently not damaged by phosphorus implant 108 remains substantially unetched at 300 Å thick.

Figure 3:
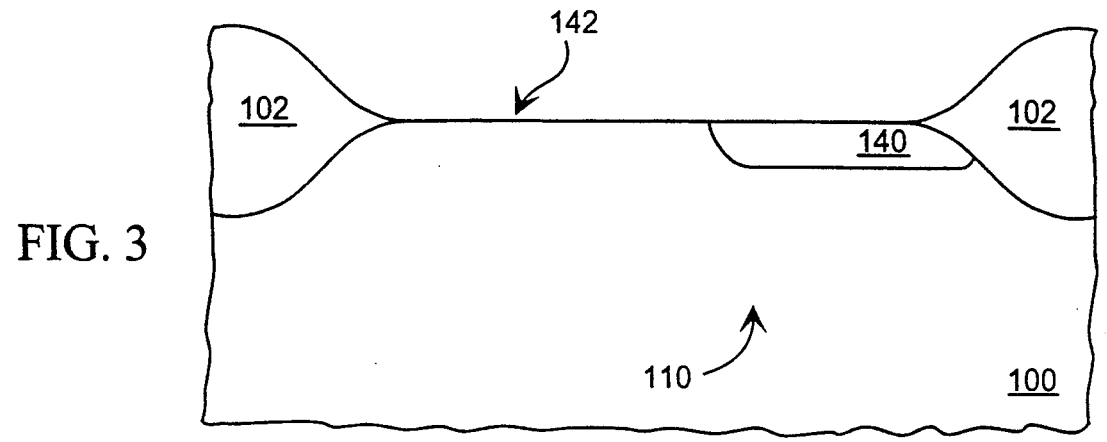
Figure 4:
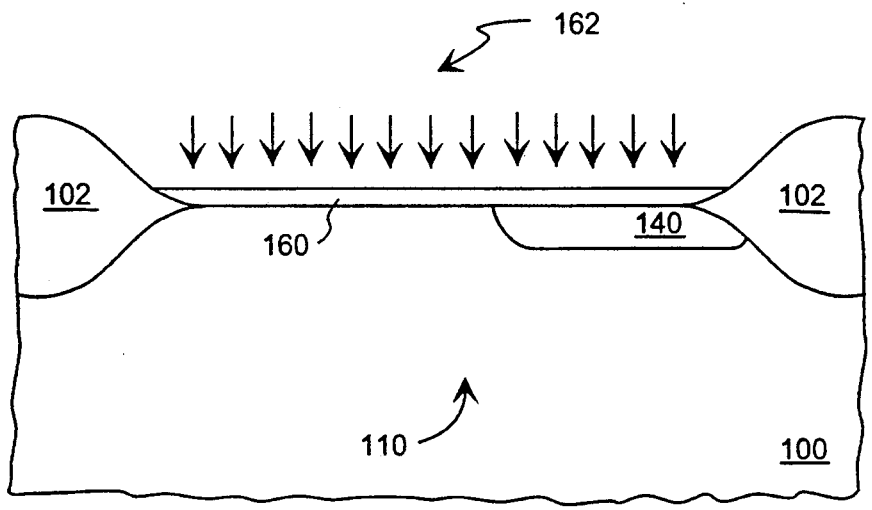

An anneal operation follows which both drives the phosphorus implant layer 120 into the substrate 100, thereby lowering the surface concentration of phosphorus, and activates the phosphorus implant, thereby forming an N+ layer in the P-well. Next, a short oxide etch removes the remaining KOOI oxide 104 and etched KOOI oxide 122 from the surface of the P-well in preparation for gate oxidation. This pre-gate oxidation etch step is a 1.7 minute dip in 10:1 HF. The resulting structure is shown in FIG. 3, and shows P-well active area surface 142 free of overlying oxide, and further shows the formation of N+ layer 140, being deeper and broader than the previous unactivated phosphorus implant layer 120 due to the drive in accomplished during the previous anneal step.

Next, a gate oxide is formed over the P-well active area 110. This is grown in a dry oxidation environment and results in the structure of FIG. 4. Gate oxide 160 is approximately 225 Å thick. An in-situ anneal is performed at the conclusion of the gate oxidation cycle by changing the ambient gases in the oxidation furnace to an inert (e.g., Argon) annealing ambient, while continuing to apply a high temperature. $V_{TI}$ Implant 162 is then implanted over the whole wafer to set the nominal threshold of MOS transistors to be fabricated later in the P-wells. This is a light boron implant which is applied without any masking photoresist (i.e. a "blanket implant") to both P-well regions and N-well regions (not shown). A separate $V_{TP}$ implant (not shown) is then implanted into the N-well regions (not shown) to adjust the threshold of P-channel MOS transistors to be fabricated later in the N-wells. To accomplish this, a photoresist layer is applied and defined to cover the P-wells while exposing the N-wells, the implant into the N-wells is performed, and the photoresist overlying the P-wells then removed.

Figure 5:
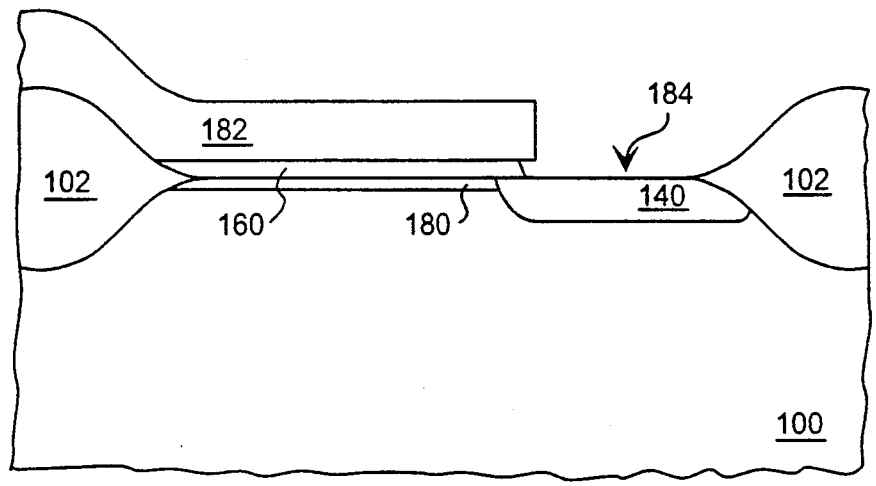
Figure 6:
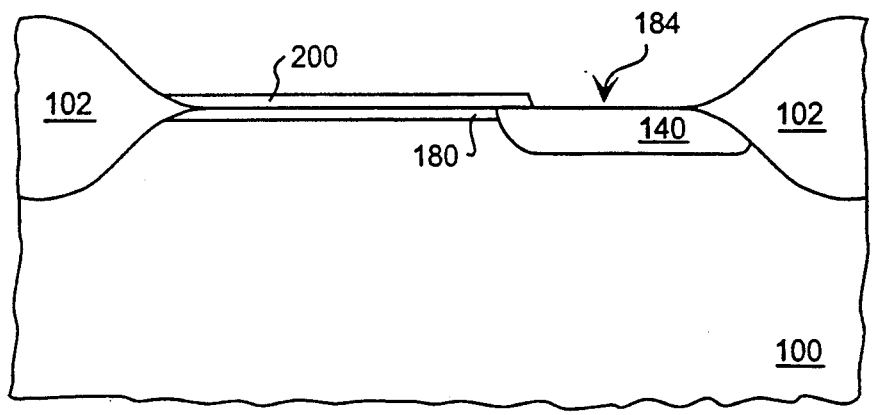

Continuing with the process sequence as affects the P-well shown, a photoresist layer is applied and defined to expose the gate oxide 160 over the N+ layer 140, followed by an etch step to remove the exposed gate oxide. This Tunnel Opening etch consists of a 0.2 minute dip in a buffered oxide etchant and removes the 225 Å of gate oxide to expose the surface of the substrate over the N+ layer 140. The resulting structure is shown in FIG. 5 and shows the N+ surface 184 exposed by the tunnel opening etch. Photoresist layer 182 defines the tunnel opening and protects the remainder of gate oxide 160 not overlying N+ layer 140. The as-yet unactivated $V_{TI}$ implant layer 180 is shown under the gate oxide 160. $V_{TI}$ implant layer 180 is not shown extending into N+ layer 140 because the doping density of N+ layer 140 is far greater than that of $V_{TI}$ implant layer 180.

Next, the photoresist layer 182 is removed and an additional etch operation is performed to reduce the thickness of gate oxide 160 from 225 Å down to approximately 140 Å. This is accomplished with a 50 second dip in 50:1 HF, and results in the structure shown in FIG. 6. Etched gate oxide 200 is approximately 140 Å thick. This 50 second dip also serves to remove any native oxide formed over N+ surface 184 subsequent to the etching of gate oxide 160.

Figure 7:
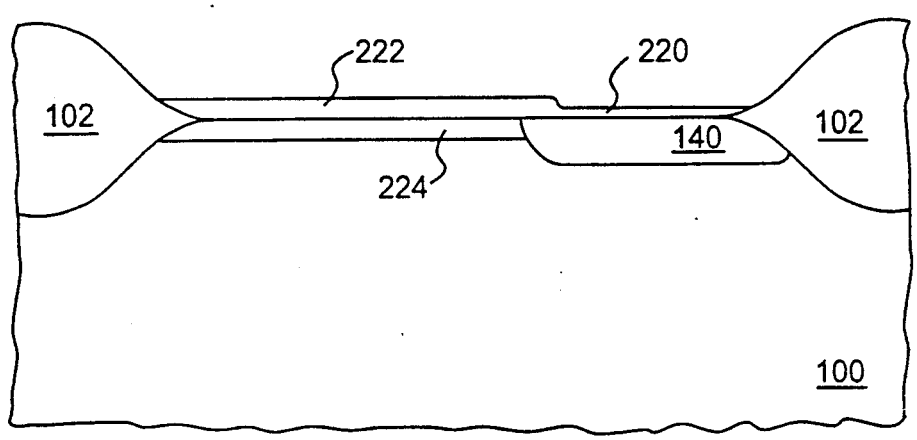

Lastly, an oxidation step both grows an oxide from N+ surface 184 over N+ layer 140, and increases the thickness of the existing etched gate oxide 200. Referring to FIG. 7, tunnel oxide 220 is nominally 87 Å thick, while reoxidized gate oxide 222 is now nominally 180 Å thick. The unactivated $V_{TI}$ implant layer 180 has been activated by the tunnel oxidation step, resulting in $V_{TI}$ layer 224.

Subsequent to this step a polysilicon layer is deposited, doped, and defined to form, in accordance with any of a variety of well-known processes, transistors, interconnect, and other features. In particular, the polysilicon is deposited above tunnel oxide 220 to form a structure useful to an EEPROM cell which will conduct a current through tunnel oxide 220 if the electric field across tunnel oxide 220 is high enough. Measurements of oxide quality can be made immediately after the polysilicon layer is patterned into useful structures.

We have found that annealing the gate oxide can drastically improve the quality of the subsequently grown tunnel oxide. To investigate the quantitative effects on tunnel oxide quality, a study was conducted using wafers fabricated using the process flow of FIGS. 1-7. FIG. 8 contains a summary of the oxidation cycle used to grow the gate oxide. As is shown, the gate oxidation proceeds as a three-stage oxidation cycle, with HCl gettering performed between the first and second stages, and again between the second and third stages. This procedure keeps the HCl away from both the silicon and the polysilicon interfaces, while still providing a high enough HCl concentration within the body of the gate oxide to getter any mobile ionic charge that may be present. HCl coming into contact with either a silicon or polysilicon interface will degrade that interface surface, and likewise degrade any oxide contiguous to that surface. After the third stage of oxidation, the anneal is performed, followed by a ramp-down in temperature. A summary of the gate oxide anneal matrix that was studied is presented in FIG. 9. The baseline gate process does not contain an anneal after the gate oxidation cycle is completed. This study investigated post gate growth anneal temperatures from 900° to 1000° C. with up to a maximum of 30 minutes of anneal time.

To determine the effects of the gate oxide annealing step on the quality of tunnel oxides grown from the P-well surface, both edge QBD and surface QBD measurements were made on structures using the tunnel oxide. QBD ("charge-to-breakdown") is a measure of the time-dependent breakdown characteristic of an oxide layer. It is measured by passing a constant current through the oxide under test (which conducts via Fowler-Nordheim tunneling), and noting the time at which the oxide breaks down electrically. Breakdown occurs due to the trapping of charge within the oxide, thereby gradually raising the electric field across the oxide until the oxide can no longer withstand the induced voltage. Higher quality oxides will trap less charge over time, and will therefore take longer to break down. The mathematical product of the forcing current times the measured time to breakdown gives rise to a charge value corresponding to the total charge passed through the oxide prior to breakdown. Higher QBD values reflect higher quality oxides.

The QBD test structures that were studied involved one structure that contained 370 tunnel opening cuts in a gate oxide region (SURFACE QBD structure). Since all of the tunnel opening cuts are within a large area of gate oxide, the LOCOS edge will not reach the 370 individual tunnel opening cuts of $1.2 \times 1.2$ $\mu m^2$ each. This makes the SURFACE QBD structure very valuable for studying the impact that surface quality alone has upon oxide quality.

A second QBD structure was utilized to study the impact of the LOCOS edge and surface combined (BULK structure). The BULK structure consisted of an area of tunnel oxide of $62.5 \times 100$ $\mu m^2$ that is encompassed by a LOCOS edge. By using the two different structures one can distinguish whether the improvement in oxide quality is driven more by the surface or the LOCOS edge.

Figure 10:
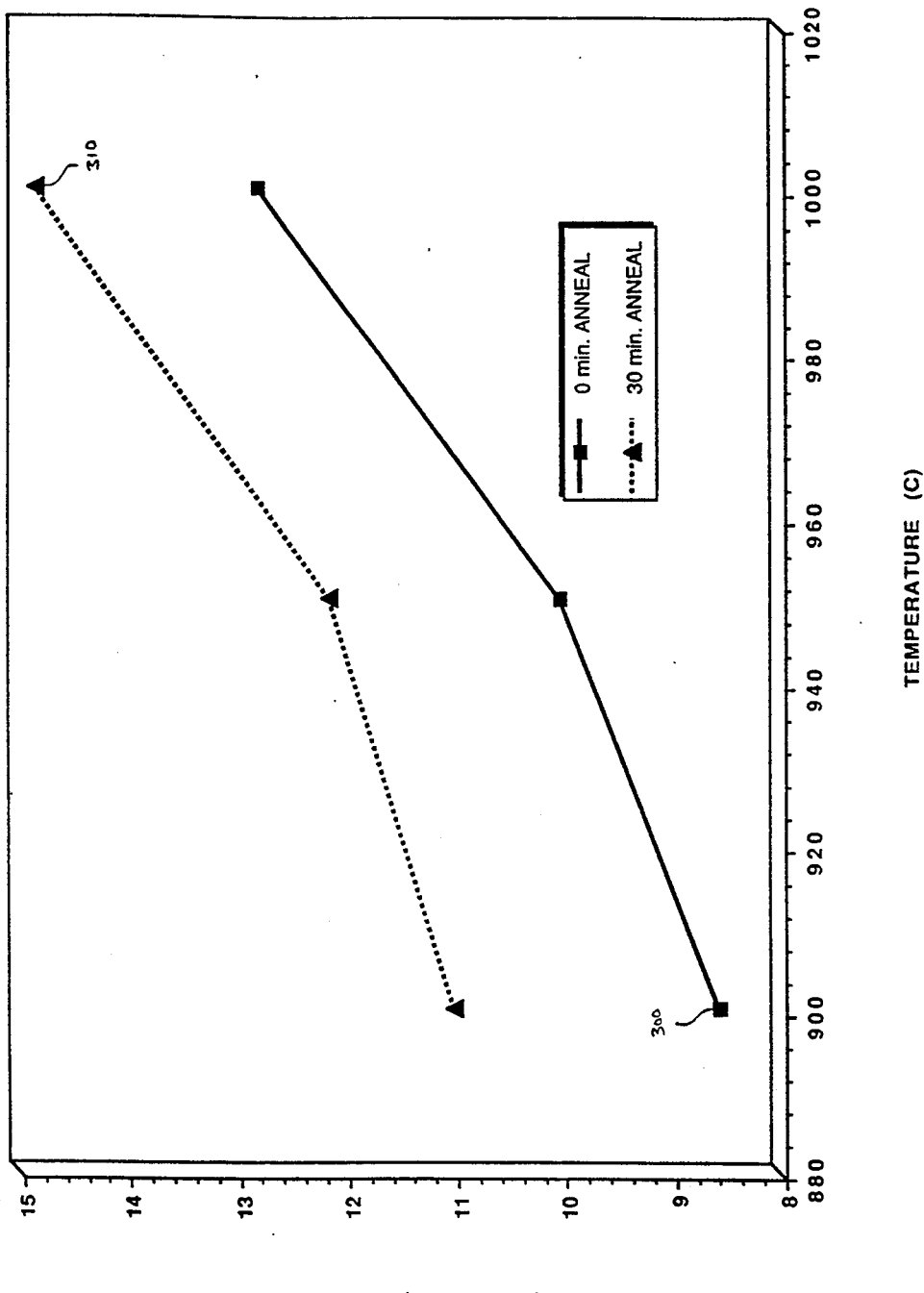
FIG. 10 is a chart which plots SURFACE QBD measurements for the various conditions outlined in the gate oxide anneal matrix of FIG. 9.
Figure 11:
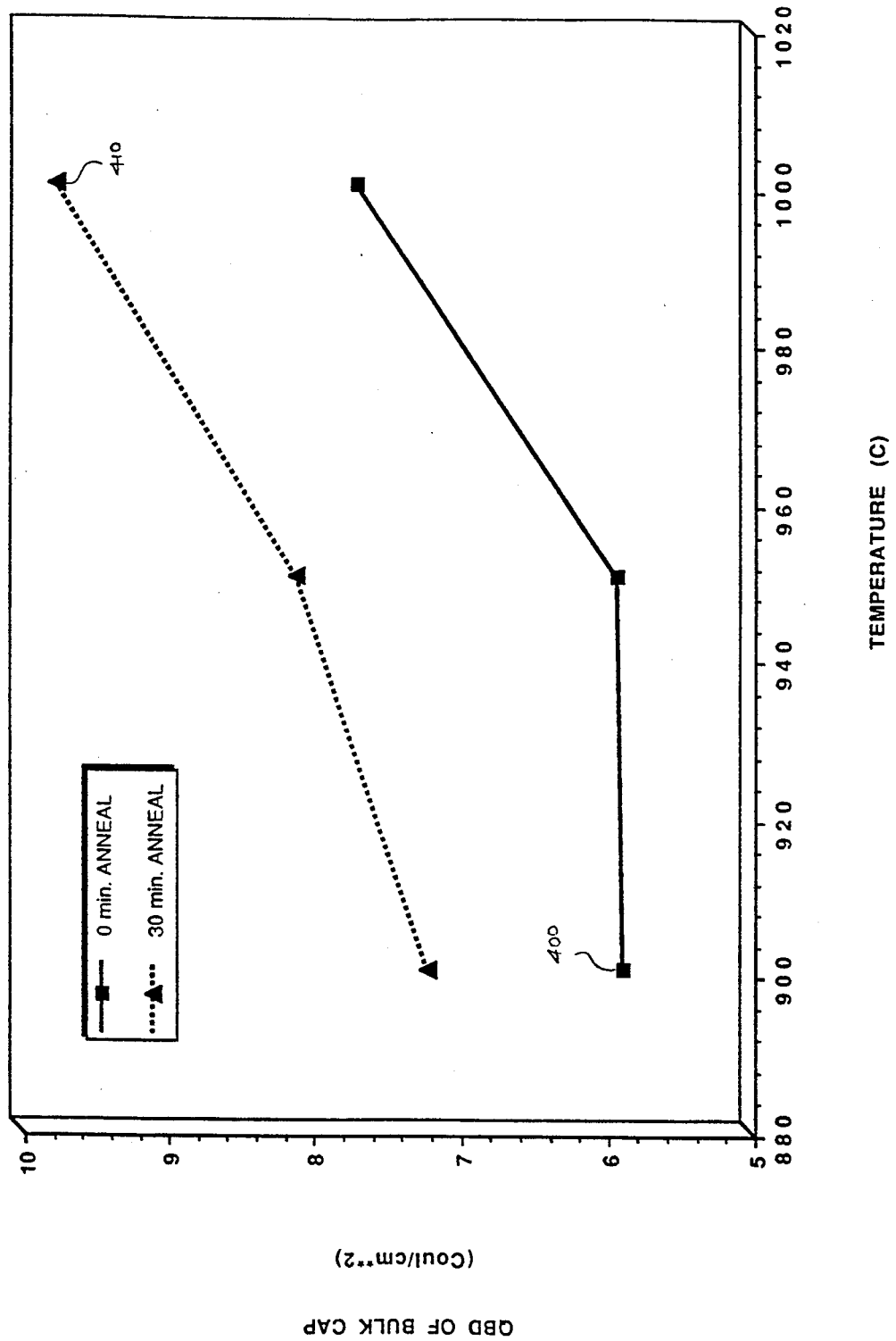
FIG. 11 is a chart which plots BULK QBD measurements for the various conditions outlined in the gate oxide anneal matrix of FIG. 9.

A superb QBD improvement was observed when both the anneal temperature and anneal time were increased after the completion of the gate oxide growth (see FIG. 10). The SURFACE QBD increased from 8.53 coul/cm$^2$ at 900° C. with 0 anneal time (data point 300) to 14.81 coul/cm$^2$ at 1000° C. with 30 min. of anneal time (data point 310), which represents a 74% improvement. Overall, both the increased anneal time and time at temperature contributed significantly to the improvement of the SURFACE QBD properties. Referring to FIG. 11, an analysis of the BULK QBD (surface+LOCOS edge) also displayed an increase from 5.85 coul/cm$^2$ (data point 400) to 9.74 coul/cm$^2$ (data point 410), representing a 66% increase between the range studied in the anneal matrix. Since both the BULK and SURFACE QBD structures showed nearly identical enhancements, this implies the silicon surface alone is primarily responsible for the tunnel oxide quality improvement. This occurs since the BULK QBD structure contains both a surface and edge component, and the SURFACE QBD structure contains only the silicon surface component. The nearly identical improvement of BULK QBD and SURFACE QBD with the IN-SITU anneal process reveals that the LOCOS edge was not the dominant cause of the oxide quality increase.

Figure 12:
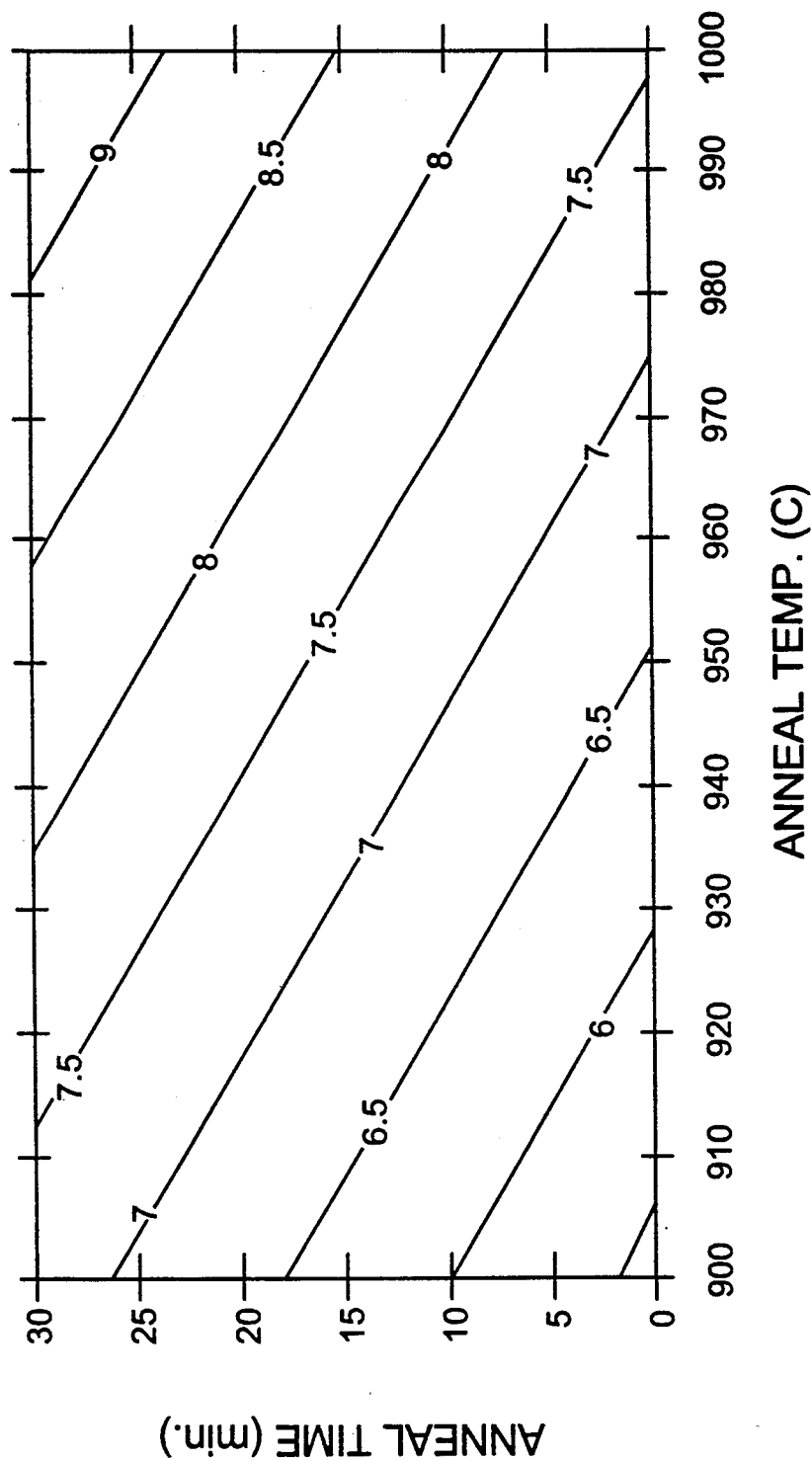
FIG. 12 is chart which plots an experimentally-fitted linear model of BULK QBD versus anneal temperature and anneal time.

The BULK QBD parameter was observed to be a linear function of both anneal temperature and time in the IN-SITU anneal process. Modeling of the BULK QBD was very successful (r-square=0.96) when linear input variables in GATE ANNEAL TIME and GATE ANNEAL TEMPERATURE were used. The resulting equation:

$$\text{BULK QBD} = 0.0219 \, (\text{ANNEAL TEMP}) + 0.062 \, (\text{ANNEAL TIME}) - 14.338 \quad (1)$$

is plotted in FIG. 12, from which one can predict the BULK QBD resulting from any combination of anneal temperature and anneal time.

It is important to note that the gate oxide initially grown in the tunnel oxide region serves as a sacrificial oxide only. Therefore, the observed tunnel oxide enhancements are entirely due to a surface effect, since the initial gate oxide 160 of 225 Å is completely removed prior to tunnel oxidation.

Figure 13:
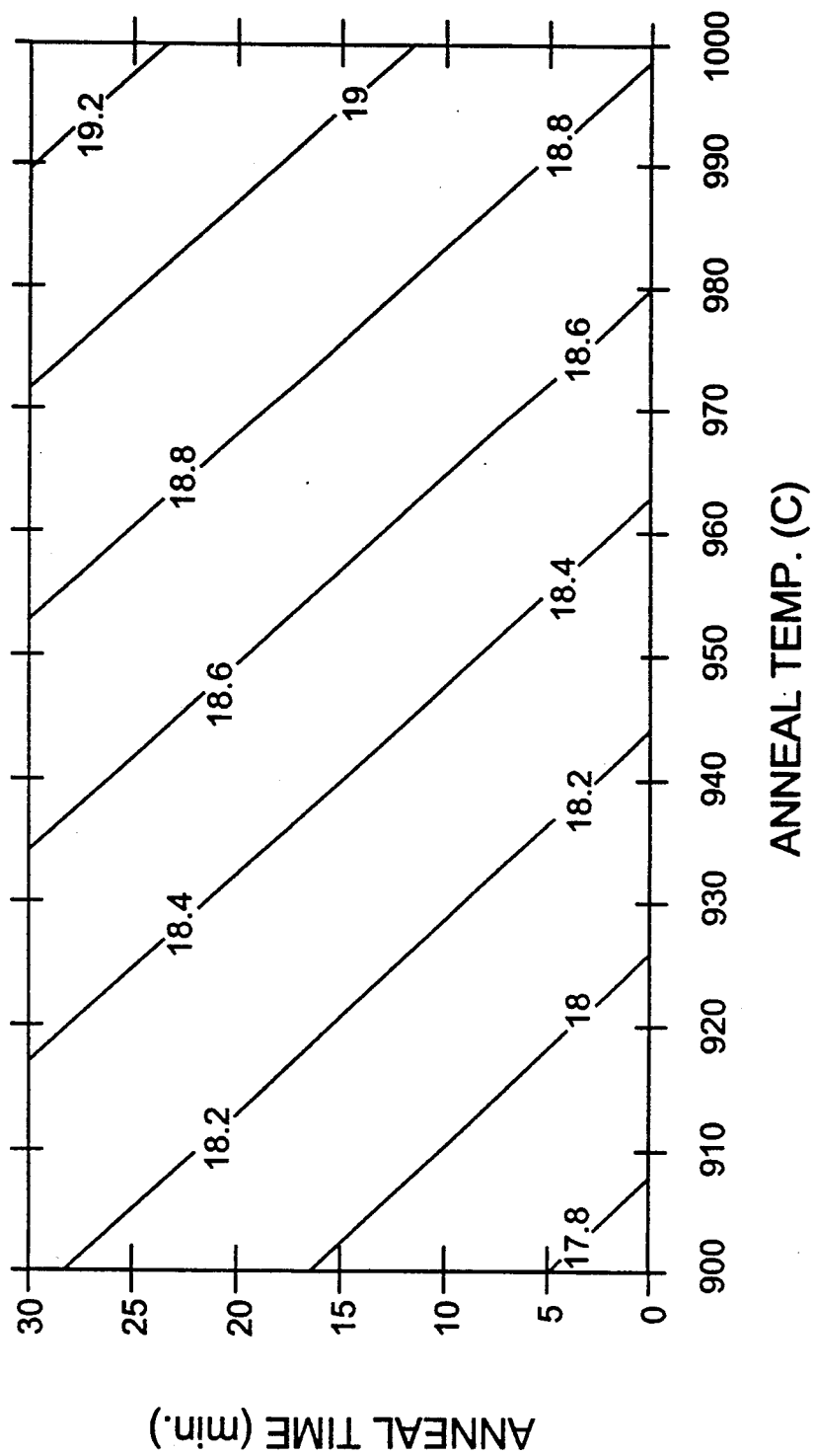
FIG. 13 is a chart which plots an experimentally-fitted linear model of P-Gate $BV_{OX}$ versus anneal temperature and anneal time.

We have also found that the addition of the gate oxide anneal step improves the quality of the gate oxide which is re-oxidized but not sacrificially removed. Referring to FIG. 7, N-channel transistors fabricated using re-oxidized gate oxide 222 show an improvement in gate oxide breakdown voltage if annealed after the initial gate oxide 160 growth (see FIG. 4). An analysis of FIG. 13 shows that the BV$_{OX}$ of the re-oxidized gate oxide (reference 222 in FIG. 7) is enhanced by 1.4 volts as the anneal conditions are varied from 900° C. within 0 min. anneal to 1000° C. within 30 min. of anneal (with a final gate oxide thickness=180 Å). All the BV$_{OX}$ structures (i.e., N-well and P-well BV$_{OX}$, P-S/D EDGE BV$_{OX}$, and N-S/D EDGE BV$_{OX}$) displayed an improvement of 1.0 volt or more with the addition of an anneal step to the gate oxide.

Applicants believe that the quality improvements to both tunnel oxides and gate oxides as a result of the gate oxide anneal step is due to the improvement of the semiconductor surface below the gate oxide by the anneal. As the data of FIGS. 10 and 11 suggest, it is not believed to be an edge-related effect. Two factors are likely contributors to this surface improvement. First, the smoothness of the interface below the initial gate oxide may be enhanced by the anneal step. Secondly, the interface charge at the silicon/oxide interface may be minimized due to the anneal step. In any case, a subsequently grown oxide or a re-oxidation of the same oxide results in a substantially higher quality oxide.

The IN-SITU technique described has far reaching implications for any oxidation cycle prior to polysilicon deposition for improved oxide quality. This technique has tremendous potential application to all MOS process technologies.

While the above descriptions reference an EEPROM technology fabricated in a CMOS technology, the teachings of this disclosure can be advantageously applied to other semiconductor process technologies incorporating thin oxides. For example, a DRAM process requiring capacitors fabricated with very thin oxide dielectrics could benefit greatly from these teachings.

While the invention has been described with respect to the embodiments set forth above, the invention is not necessarily limited to these embodiments. For example, the invention is not necessarily limited to any particular transistor process technology. Moreover, variations in certain of the process steps can be practiced. For example, single wafer RTA annealing to temperatures even higher than 1000° C. disclosed herein is believed to achieve similar, if not better quantitative improvements in oxide quality than achieved thus far. Such temperatures cannot be achieved in a furnace tube without undue diffusion effects arising from the thermal mass of the furnace and the long times required for the tube to reach such temperatures. Furthermore, while gate oxides have been traditionally grown in a dry oxidation environment, and were so grown in the experiments disclosed herein, the techniques disclosed herein are believed to be advantageous to gate oxides grown in a wet oxidation environment. Accordingly, other embodiments, variations, and improvements not described herein are not necessarily excluded from the scope of the invention, which is defined by the following claims.

We claim:

1. In an integrated circuit fabrication process, a method for growing a high quality oxide on a surface of a semiconductor body, comprising the steps of:
   growing a first oxide upon a region of the semiconductor surface;
   annealing the first oxide prior to any ion implantation therethrough;
   removing the first oxide from the semiconductor surface region following the first oxide annealing step, to expose the surface region of the semiconductor body; and
   growing a second oxide upon the exposed surface region of the semiconductor body following the first oxide removing step.

2. A method as in claim 1, further comprising the step of heavily doping a portion of the semiconductor body under the surface region of the semiconductor body prior to the first oxide growing step.

3. In an integrated circuit fabrication process, a method for providing a first high quality oxide upon a surface of a semiconductor body, and a second high quality oxide, of lesser thickness than the first high quality oxide, upon the surface of the semiconductor body, comprising the steps of:
   oxidizing the semiconductor body to form a first oxide upon the surface of the semiconductor body;
   annealing the first oxide prior to any ion implantation therethrough;
   removing a first region of the first oxide to expose the surface of the semiconductor body, and leaving a remaining region of the first oxide; and
   oxidizing the semiconductor body to form a second oxide on the expose surface of the semiconductor body and to thicken the remaining region of the first oxide.

4. A method as in claim 3 wherein the anneal step is performed in-situ with the first oxide growing step.

5. A method as in claim 4 wherein the anneal step is performed at a temperature in the range of 900° to 1000° C.

6. A method as in claim 3 wherein the anneal step comprises a single-wafer RTA anneal step.

7. A method as in claim 3 wherein the first oxide growing step is performed in a wet oxidation environment.

8. A method as in claim 3 wherein the first oxide growing step is performed in a wet oxidation environment.

9. A method as in claim 3 further comprising the step, subsequent to the removing step, of etching the remaining region of the first oxide to reduce the thickness thereof.

10. In an integrated circuit fabrication process, a method for forming a first high quality oxide upon a surface of a semiconductor body, and a second high quality oxide, of lesser thickness than the first high quality oxide, upon the surface of the semiconductor body over a heavily-doped layer therein, comprising the steps of:
    forming the heavily-doped layer in the semiconductor body;
    oxidizing the semiconductor body to form a first oxide upon a first surface region of the semiconductor body over the heavily-doped layer and upon a second surface region of the semiconductor body;
    annealing the first oxide prior to any ion implantation therethrough;
    depositing a photoresist layer on the first oxide;
    removing a region of the photoresist layer to expose a region of the first oxide over the heavily-doped layer, and leaving a remaining region of the photoresist layer;
    removing the exposed region of the first oxide, to expose a portion of the surface of the semiconductor body over the heavily-doped layer, and leaving a remaining region of the first oxide;
    removing the remaining region of the photoresist layer, to expose the remaining region of the first oxide;
    etching the remaining region of the first oxide to reduce the thickness thereof; and
    oxidizing the semiconductor body to form a second oxide on the exposed surface portion of the semiconductor body and to thicken the remaining region of the first oxide.

11. A method as in claim 10 wherein the oxidation step forming the first oxide comprises growing the first oxide to a thickness of approximately 225 Å and wherein the first oxide removing step comprises etching the first oxide for approximately 0.2 minutes using a buffered oxide etchant.

12. A method as in claim 11 wherein the first oxide etching step comprises etching the remaining region of the first oxide for approximately 50 seconds using 50:1 HF.

13. In an integrated circuit fabrication process suitable for EEPROM devices, a method for growing a tunnel oxide upon a surface of a semiconductor body over a heavily-doped N+ layer, and further for growing a gate oxide, of greater thickness than the tunnel oxide, upon the surface of the semiconductor body, comprising the steps of:
    growing a first oxide upon the surface of the semiconductor body;
    implanting an N-type dopant through the first oxide into a first surface region of the semiconductor body, to form an implanted layer;
    annealing the implanted layer to form a heavily-doped N+ layer;
    removing the first oxide subsequent to the implanted layer annealing step;
    growing a second oxide upon the first surface region of the semiconductor body over the heavily-doped N+ layer, and upon a second surface region of the semiconductor body;
    annealing the second oxide prior to any ion implantation therethrough;
    depositing a photoresist layer on the second oxide;

removing a region of the photoresist layer to expose a region of the second oxide over the heavily-doped N+ layer, and leaving a remaining region of the photoresist layer;

removing the exposed region of the second oxide, to expose the surface of the semiconductor body over the heavily-doped N+ layer, and leaving a remaining region of the second oxide;

removing the remaining region of the photoresist layer, to expose the remaining region of the second oxide;

etching the remaining region of the second oxide to reduce its thickness; and growing a tunnel oxide on the exposed surface of the semiconductor body while re-oxidizing the remaining region of the second oxide to form the gate oxide.

* * * * *